(12) United States Patent
Ozoe

(10) Patent No.: US 10,992,223 B2
(45) Date of Patent: Apr. 27, 2021

(54) SEMICONDUCTOR DEVICE HAVING POWER SUPPLY VOLTAGE CIRCUIT, CHARGE PUMP, COMPARATOR, AND LOAD CIRCUIT FOR CONTROLLING MEMORY DEVICE

(71) Applicant: RENESAS ELECTRONICS CORPORATION, Tokyo (JP)

(72) Inventor: Hidetoshi Ozoe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/456,253

(22) Filed: Jun. 28, 2019

(65) Prior Publication Data

US 2020/0036285 A1    Jan. 30, 2020

(30) Foreign Application Priority Data

Jul. 24, 2018 (JP) .............................. JP2018-138167

(51) Int. Cl.
*H02M 3/07* (2006.01)
*G11C 16/30* (2006.01)
*G11C 16/08* (2006.01)

(52) U.S. Cl.
CPC .............. *H02M 3/07* (2013.01); *G11C 16/08* (2013.01); *G11C 16/30* (2013.01)

(58) Field of Classification Search
CPC ........... G11C 16/08; G11C 16/20; H02M 3/07

USPC ........................... 365/226, 227, 185.18, 204
See application file for complete search history.

(56) References Cited

U.S. PATENT DOCUMENTS

| | | | |
|---|---|---|---|
| 7,956,675 B2* | 6/2011 | Saitoh | H02M 3/073 327/536 |
| 2007/0008799 A1* | 1/2007 | Dono | G11C 8/08 365/222 |
| 2012/0140578 A1* | 6/2012 | Goto | H03L 7/0816 365/189.07 |
| 2018/0336952 A1* | 11/2018 | Miyazaki | G11C 16/28 |

FOREIGN PATENT DOCUMENTS

JP        2006-293802 A      10/2006

\* cited by examiner

*Primary Examiner* — Connie C Yoha
(74) *Attorney, Agent, or Firm* — McDermott Will & Emery LLP

(57) ABSTRACT

A semiconductor device capable of stabilizing an internal voltage is provided. According to one embodiment, the semiconductor device comprises a stabilized power supply circuit for generating a first voltage, a charge pump circuit for generating a second voltage different from the first voltage using the first voltage, the COUT2 including a comparison circuit for comparing the second voltage with a reference voltage, and a dummy load circuit controlled to be turned on or off in response to a comparison result signal COUT2 outputted from the comparison circuit, and the Dummy load circuit receives the comparison result signal COUT2 and is turned on for a predetermined period, whereby at least a part of a current IDD based on the first voltage flows into the dummy load circuit.

19 Claims, 15 Drawing Sheets

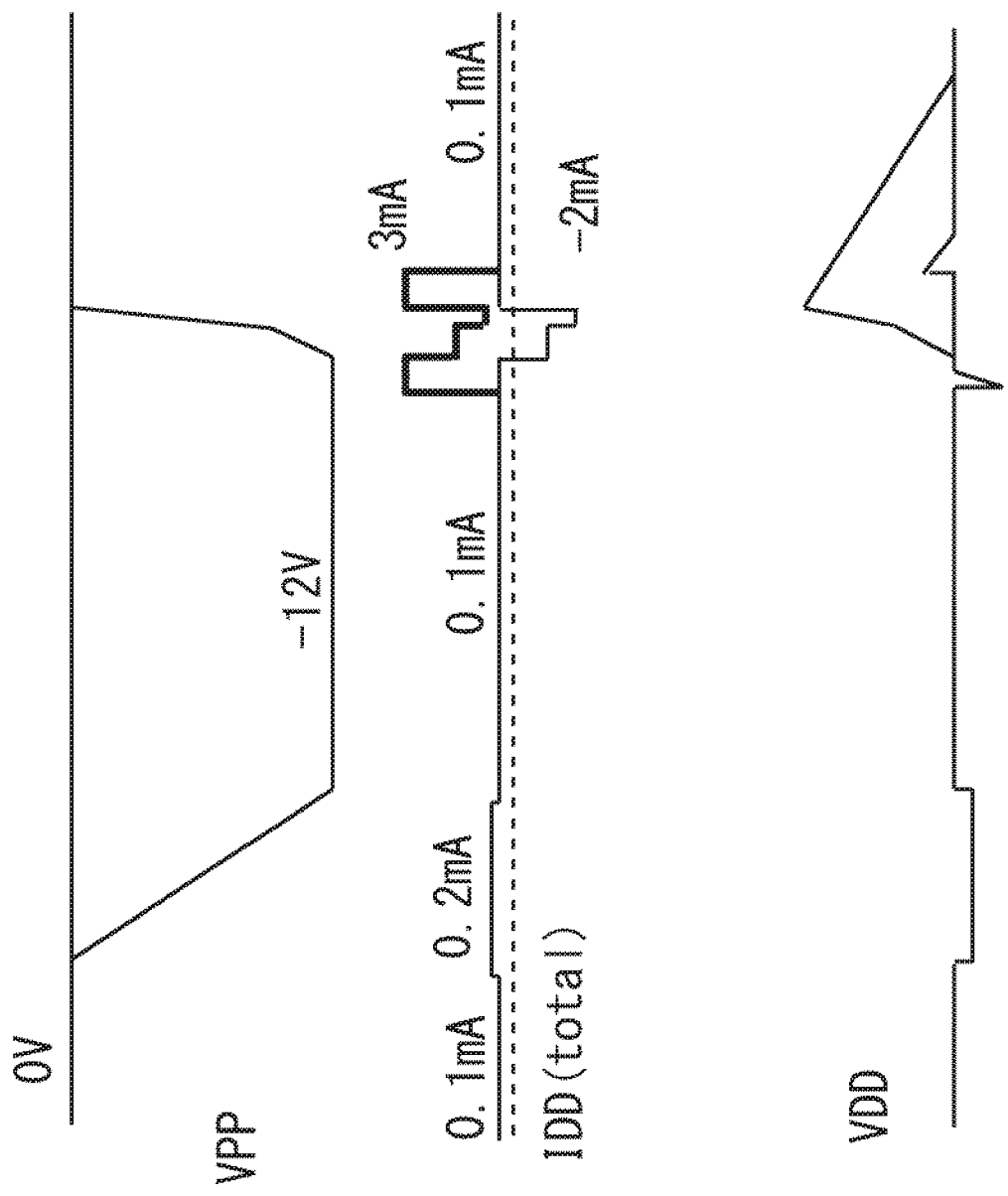

SEMICONDUCTOR DEVICE HAVING POWER SUPPLY VOLTAGE CIRCUIT, CHARGE PUMP, COMPARATOR, AND LOAD CIRCUIT FOR CONTROLLING MEMORY DEVICE

CROSS-REFERENCE TO RELATED APPLICATIONS

The disclosure of Japanese Patent Application No. 2018-138167 filed on Jul. 24, 2018 including the specification, drawings and abstract is incorporated herein by reference in its entirety.

BACKGROUND

The present invention relates to a semiconductor device, and more particularly, to a semiconductor device including a charge pump.

In recent years, miniaturization of processes has progressed, and the core power supply voltage has also decreased in proportion to a decrease in the breakdown voltage of a device. However, the voltage used at the time of data rewriting in a semiconductor memory device, particularly a flash memory, is still high. Therefore, as the power supply voltage drops, the voltage step-up ratio of Charge pump circuit increases, and the operating current tends to increase. In the Stabilized power supply circuit where the power supply voltage is supplied to the Charge pump circuit, the increase in the operating current causes the load variation of the output voltage to increase due to the effect of the response rate. The voltage drop in the output voltage causes performance degradation. Further, a voltage rise in the output voltage lowers the breakdown voltage life of the device. For this reason, there is a need for a technique for suppressing the influence of the load fluctuation of the power supply voltage.

SUMMARY

The Stabilized power supply circuit shown in FIG. 14 includes a differential amplifier circuit AMP, a P-channel output MOSFET Q1, and a Voltage dividing circuit and a Dummy load circuit for forming feedback signals NFB. A Normal load circuit including active circuits such as CPUs and memories is equivalently represented as resistive elements. Flash memories, EEPROM memories, and the like included in this Normal load circuit require a boosted voltage VPP obtained by boosting the internal voltage VDD in order to write data or erase data. In particular, the Charge pump circuit shown in FIG. 14 receives the internal voltage VDD and forms the boosted voltage VPP of the opposite polarity to the internal voltage VDD.

In order to reduce the power consumed by the system LSI, the Charge pump circuit is controlled to operate only when the flash memory or the like is in an operation mode in which the boosted voltage VPP of the opposite polarity is required for a write operation or an erase operation in order to reduce the power consumed by the system LSI. Therefore, when the operation mode of the flash memory or the like is finished, the Charge pump circuit is controlled to stop the operation even when the system LSI is active.

As shown in the diagram of FIG. 15, when the Charge pump circuit stops operating, for example, the boosted voltage VPP changes from −12V to 0V. The voltage change of the boosted voltage VPP acts to change the internal voltage VDD by the parasitic capacitance CST of FIG. 14.

In particular, in the Stabilized power supply circuit as shown in FIG. 14, the internal voltage VDD has substantially no current sinking capability because the internal voltage VDD itself consumes low power, and therefore, there is a possibility that the internal voltage VDD is greatly jumped up.

The Dummy load circuit of FIG. 14 is also used to prevent the internal voltage VDD from jumping up due to the voltage change of the boosted voltage VPP. That is, at the timing when the boosted voltage VPP changes, the dummy load current IDD is caused to flow prior to the change of the boosted voltage VPP, as indicated by the thick line in FIG. 15. Even when the load changes in the active state, the internal voltage VDD can be stabilized by using the Dummy load circuit voltage VDD.

When the boosted voltage VPP, which is an output, reaches a desired value, the Charge pump circuit stops boosting the boosted voltage VPP. The Charge pump circuit starts boosting again when the charges of the boosted voltage VPP are consumed and the boosted voltage VPP falls below a desired value. That is, even when the Charge pump circuit is active, the voltage is repeatedly raised and stopped. Therefore, even when the Charge pump circuit is active, there is a problem that a load variation occurs. Other objects and novel features will become apparent from the description of this specification and the accompanying drawings.

According to an embodiment, a semiconductor device comprising: a stabilized power supply circuit generates a first voltage; a charge pump circuit generates a second voltage using the first voltage, compares the second voltage with a reference voltage, and outputs a comparison result signals; and a dummy load circuit that is controlled to be in an on-state or an off-state in response to the comparison result signals; and wherein the stabilized power supply circuit provides at least a portion of the current based on the first voltage to the dummy load circuit in the on-state Semiconductor device.

BRIEF DESCRIPTION OF THE DRAWINGS

FIG. 15 is a graph illustrating the system LSI operating waveform, with the horizontal axis indicating time and the vertical axis indicating the intensity of the voltage or current.

DETAILED DESCRIPTION

Figure 1:
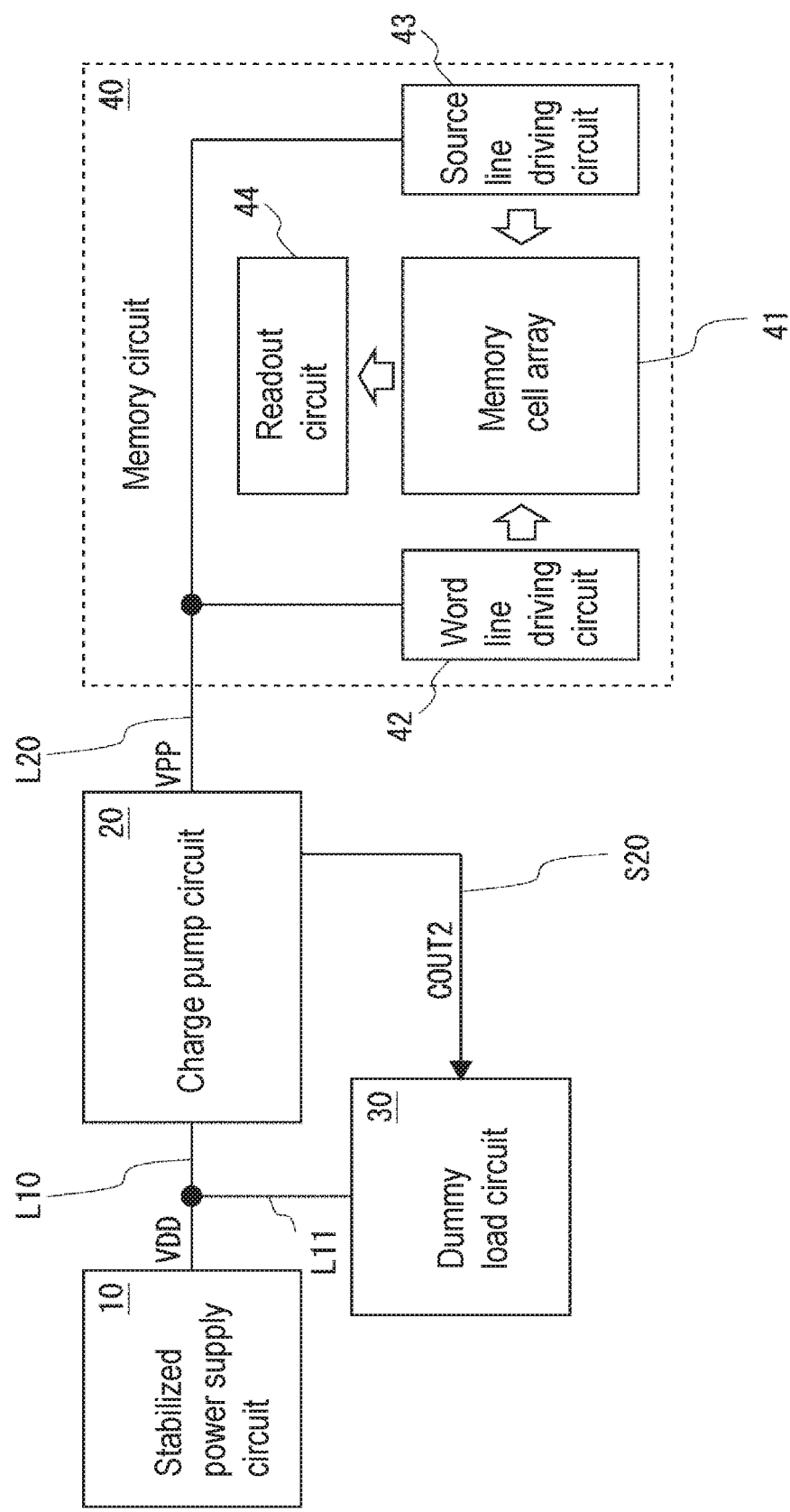
FIG. 1 is a configuration diagram illustrating a semiconductor device according to a first embodiment.

For clarity of explanation, the following description and drawings are appropriately omitted and simplified. In the drawings, the same elements are denoted by the same reference numerals, and a repetitive description thereof is omitted as necessary.

A semiconductor device according to Embodiment 1 will be described. First, the configuration of the semiconductor device according to the first embodiment will be described. FIG. 1 is a configuration diagram illustrating a semiconductor device 1 according to a first embodiment. As shown in FIG. 1, the semiconductor device 1 includes a Stabilized power supply circuit 10, a Charge pump circuit 20, a Dummy load circuit 30, and a Memory circuit 40.

The Stabilized power supply circuit 10 generates an internal voltage VDD, and supplies the generated internal voltage VDD to predetermined circuits provided inside the semiconductor device 1. The internal voltage VDD is an operating voltage of a predetermined circuit. The predetermined circuits are, for example, CPUs and the Charge pump circuit 20. The Stabilized power supply circuit 10 is connected to the Charge pump circuit via a wire L10. The Stabilized power supply circuit 10 supplies the internal voltage VDD to the Charge pump circuit 20 via the interconnection L10.

The Charge pump circuit 20 generates the boosted voltage VPP using the internal voltage VDD. The boosted voltage VPP is a voltage different from the internal voltage VDD. That is, if the boosted voltage VPP is different from the internal voltage VDD, the boosted voltage VPP may be larger or smaller than the internal voltage VDD when the positive and negative of the boosted voltage VPP are the same as the internal voltage VDD. When the internal voltage VDD is different in positive and negative, the absolute value may be larger or smaller than the internal voltage VDD. In this specification, the internal voltage VDD is also referred to as a first voltage, and the boosted voltage VPP is also referred to as a second voltage.

The Charge pump circuit 20 supplies the generated boosted voltage VPP to the Memory circuit 40. The Charge pump circuit 20 is connected to the Memory circuit 40 via a wire L20. The Charge pump circuit 20 supplies the boosted voltage VPP to the Memory circuit 40 via the wire L20.

The Memory circuit 40 includes a Memory cell array 41, a word-line driver 42, a Source line driving circuit 43, and a Readout circuit 44. The word-line driving circuits 42 and the Source line driving circuit 43 are connected to the wirings L20, respectively. As a result, the word-line driver 42 and the Source line driving circuit 43 are supplied with the boosted voltage VPP from the Charge pump circuit 20. The Memory cell array 41 includes a plurality of memory cells arranged in matrices. When a read operation is performed on a memory cell, a predetermined memory cell is selected by driving the word-line driving circuits 42 and the Source line driving circuit 43. Then, the Readout circuit 44 reads the data of the selected memory cell. The same applies to the case where the write operation is performed on the memory cell. In this manner, the Memory circuit 40 operates at the boosted voltage VPP.

The Charge pump circuit 20 is connected to the Dummy load circuit 30 via a signal line S20. The Charge pump circuit 20 outputs the comparison-result signal COUT2 to the Dummy load circuit 30 via the signal line S20. The Dummy load circuit 30 is connected to the wiring L10 via the wiring L11.

Figure 2:
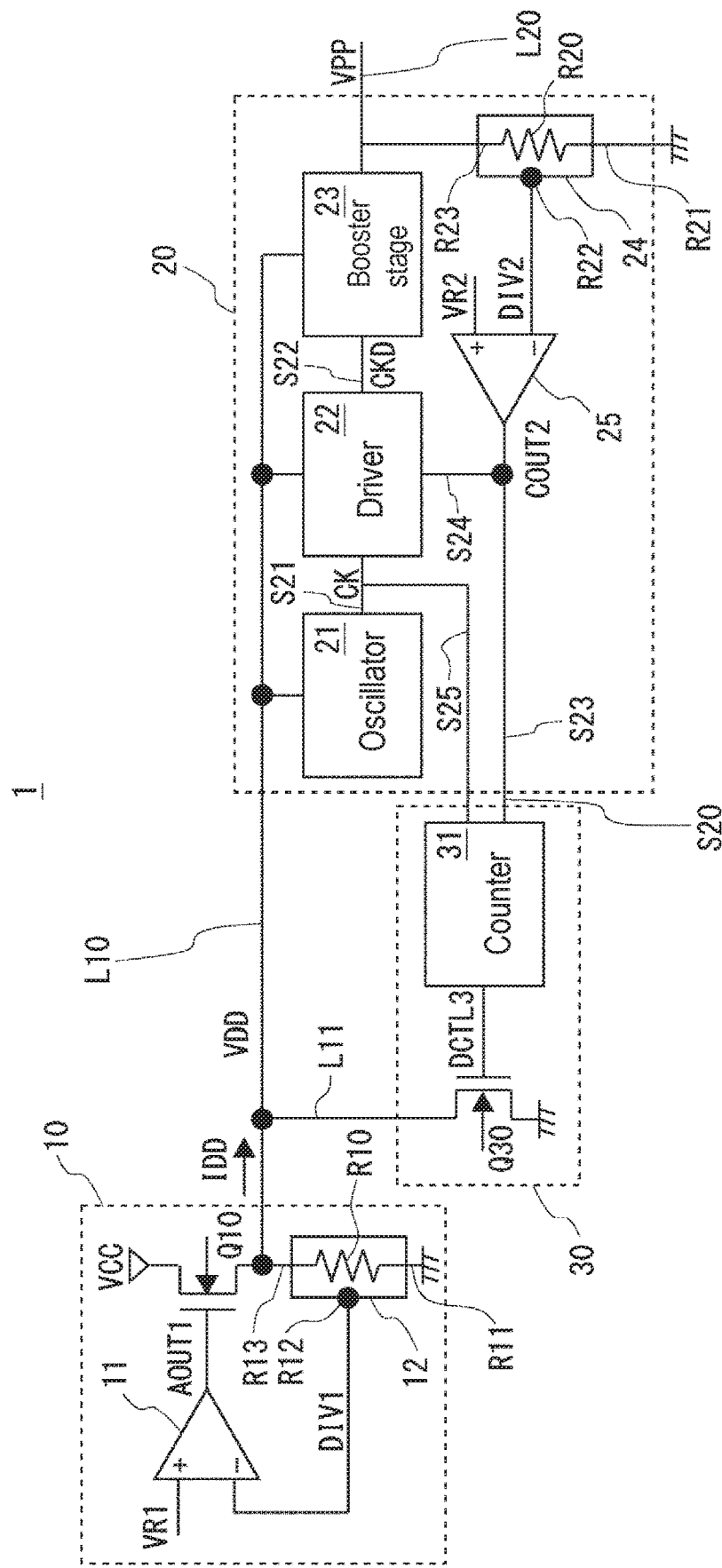
FIG. 2 is a configuration diagram illustrating a Stabilized power supply circuit, a Charge pump circuit, and a Dummy load circuit of a semiconductor device according to a first embodiment.

FIG. 2 is a configuration diagram illustrating the Stabilized power supply circuit 10, the Charge pump circuit 20, and the Dummy load circuit 30 of the semiconductor device 1 according to the first embodiment. As shown in FIG. 1 and FIG. 2, the Stabilized power supply circuit 10 includes, for example, an amplifier circuit 11, a voltage divider circuit 12, and a transistor Q10. In order to distinguish it from other Voltage dividing circuits and transistors, the voltage dividing circuit 12 is referred to as a power supply voltage dividing circuit 12, and the transistor Q10 is referred to as a power supply transistor Q10.

The amplifier circuit 11 has a non-inverting input terminal, an inverting input terminal, and an output terminal. The voltage dividing circuit 12 includes a variable resistor R10 having one terminal R11 and the other terminal R13. The variable terminal of the variable resistor R10 is denoted by R12. The transistor Q10 is, for example, an N-channel transistor, and has a source, a drain, and a gate.

A reference voltage VR1 is input to a non-inverting input terminal of the amplifier circuit 11. The inverting input terminal of the amplifier circuit 11 is connected to a variable terminal R12 of the variable resistor R10 of the voltage divider circuit 12. The output terminal of the amplifier circuit 11 is connected to the gate of the transistor Q10. The amplifying circuit 11 receives the Voltage dividing signal DIV1 from the terminal R12 and outputs the amplified signal AOUT1 to the gate of the transistor Q10. The reference voltage VR1 is also referred to as a power supply reference voltage VR1.

The terminal R11, which is one end of the variable resistor R10 in the voltage dividing circuit 12, is grounded. The variable terminal R12 of the voltage divider circuit 12 is connected to the inverting input terminal of the amplifier circuit 11. The terminal R13 of the variable resistor R10 is connected to the source of the transistor Q10.

The drain of the transistor Q10 is connected to the external power supply VCC. The source of the transistor Q10 is connected to the terminal R13 of the variable resistor R10. The gate of the transistor Q10 is connected to the output terminal of the amplifier circuit 11. Note that the polarity of the transistor Q10 may be reversed, and in this case, the source and the drain are reversed.

The Stabilized power supply circuit 10 generates and outputs an internal voltage VDD in accordance with the external power supply VCC input from the drain of the transistor Q10 and the reference voltage VR1 input to the non-inverting input terminal of the amplifier 11. The line L10 extends from between the source of the transistor Q10 and the terminal R13 of the variable resistor R10 to the Charge pump circuit 20. The Stabilized power supply circuit 10 outputs the internal voltage VDD to the Charge pump circuit 20 via the interconnection L10.

The Charge pump circuit 20 includes a Oscillator 21, drivers 22, a Booster stage 23, a voltage divider circuit 24, and a comparator circuit 25. The voltage dividing circuit 24 includes a variable resistor R20 having one terminal R21 and the other terminal R23. The variable terminal of the variable resistor R20 is denoted by R22. The comparison circuit 25 has an output terminal, a non-inverting input terminal, and an inverting input terminal. The Oscillator 21, the drivers 22, and the Booster stage 23 are connected to the wire L10. The Oscillator 21, the drivers 22, and the Booster stage 23 are supplied with the internal voltage VDD via the interconnection L10.

The Oscillator 21 oscillates the clock signal CK. The Oscillator 21 is connected to the drivers 22 via the signal lines S21. The Oscillator 21 outputs the clock signal CK to the drivers 22 via the signal line S21. The Oscillator 21 is connected to the Dummy load circuit 30 via a signal line S25. The Oscillator 21 outputs the clock signal CK to the Dummy load circuit 30 via the signal line S25.

The drivers 22 are connected to the Booster stage 23 via signal lines S22. The driver 22 receives the clock signal CK supplied from the Oscillator 21, and outputs the driver output signal CKD to the Booster stage 23 via the signal line S22.

The Booster stage 23 receives the driver output signal CKD and generates the boosted voltage VPP using the internal voltage VDD. The Booster stage 23 is connected to the wire L20. The wire L20 extends from the Booster stage 23 to the Memory circuit 40. The Booster stage 23 outputs the boosted voltage V PP to the Memory circuit 40 via the line L20.

The terminal R21 of the variable resistor R20 in the voltage dividing circuit 24 is grounded. The terminal R23 of the variable resistor R20 is connected to the wiring L20. The variable terminal R22 of the variable resistor R20 is connected to the inverting input terminal of the comparison circuit 25. The voltage divider 24 outputs the Voltage dividing level signal DIV2 from the terminal R22 in accordance with the change in the boosted voltage VPP output from the terminal R23.

The reference voltage VR2 is input to a non-inverting input terminal of the comparator 25. The inverting input terminal of the comparison circuit 25 is connected to the variable terminal R22 of the variable resistor R20. An output terminal of the comparator 25 is connected to the Dummy load circuit 30 via a signal line S23. An output terminal of the comparison circuit 25 is connected to the driver 22 via the signal line S24. The comparator 25 compares the boosted voltage VPP with the reference voltage VR2. Specifically, the comparator 25 compares the value of the boosted voltage VPP inputted via the Voltage dividing level signal DIV2 with the value of the reference voltage VR2. The comparator 25 outputs the comparison result signal COUT2 to the Dummy load circuit 30 via the signal line S23. The signal line S23 corresponds to the signal line S20 in FIG. 1.

The comparator 25 outputs the comparison result signal COUT2 to the drivers 22 via the signal line S24. The driver 22 receives the clock signal CK and the comparison result signal COUT2, and is controlled to output a driver output signal CKD.

With this configuration, the Charge pump circuit 20 generates the boosted voltage VPP using the reference voltage VR2 input to the non-inverting input terminal of the comparator 25 in addition to the internal voltage VDD supplied from the Stabilized power supply circuit 10. The Charge pump circuit 20 supplies the generated boosted voltage VPP to the Memory circuit 40 via the wire L20. The Charge pump circuit 20 also outputs the comparison-result signal COUT2 and the clock signal CK to the Dummy load circuit 30. Thus, the Charge pump circuit 20 controls the Dummy load circuit 30.

The Dummy load circuit 30 includes a counter 31 and a transistor Q30. The transistor Q30 is, for example, an N-channel transistor, and has a source, a drain, and a gate. To distinguish transistor Q30 from other transistors, it is also referred to as inflow transistor Q30.

The counter 31 is connected to the Oscillator 21 via a signal line S25. The counter 31 is connected to an output terminal of the comparison circuit 25 via a signal line S23. The counter 31 is connected to the gate of the transistor Q30. The counter 31 receives the comparison result signal COUT2 input via the signal line S23 and the clock signal CK input via the signal line S25, and outputs a dummy control signal DCTL3 to the transistor Q30.

The counter 31 counts for a predetermined period, for example, and outputs an H level or an L level to the dummy control signal DCTL3. The H level is, for example, a signal to be turned on, and the L level is a signal to be turned off. As described above, the dummy control signal DCTL3 is a signal for turning on or off the transistor Q30. Thus, the counter 31 controls the gate of the transistor Q30 to turn on or off the transistor Q30.

The source of the transistor Q30 is grounded. The drain of the transistor Q30 is connected to a wiring L10 connecting the Stabilized power supply circuit 10 and the Charge pump circuit 20 via a wiring L11. The transistor Q30 receives the dummy control signal DCTL3 outputted from the counter 31, and is controlled so that at least a part of the current IDD based on the internal voltage VDD flows through the dummy control signal DCTL3. For example, when the gate of the transistor Q30 is turned on, conduction is established between the drain and the source, and at least a part of the current IDD based on the internal voltage VDD flows in from the wiring L11.

With such a configuration, the Dummy load circuit 30 receives the comparison result signals COUT2 outputted from the comparison circuits 25, and is controlled to be in the on-state or the off-state. Then, the Dummy load circuit 30 is turned on for a predetermined period in response to the comparison result signal COUT2. As a result, at least a part of the current IDD based on the internal voltage VDD flows into the Dummy load circuit 30. Specifically, the Dummy load circuit 30 is controlled to be turned on or off in response to the clock signal CK in addition to the comparison result signal COUT2, and a part of the current IDD flows into the transistor Q30.

Figure 3:
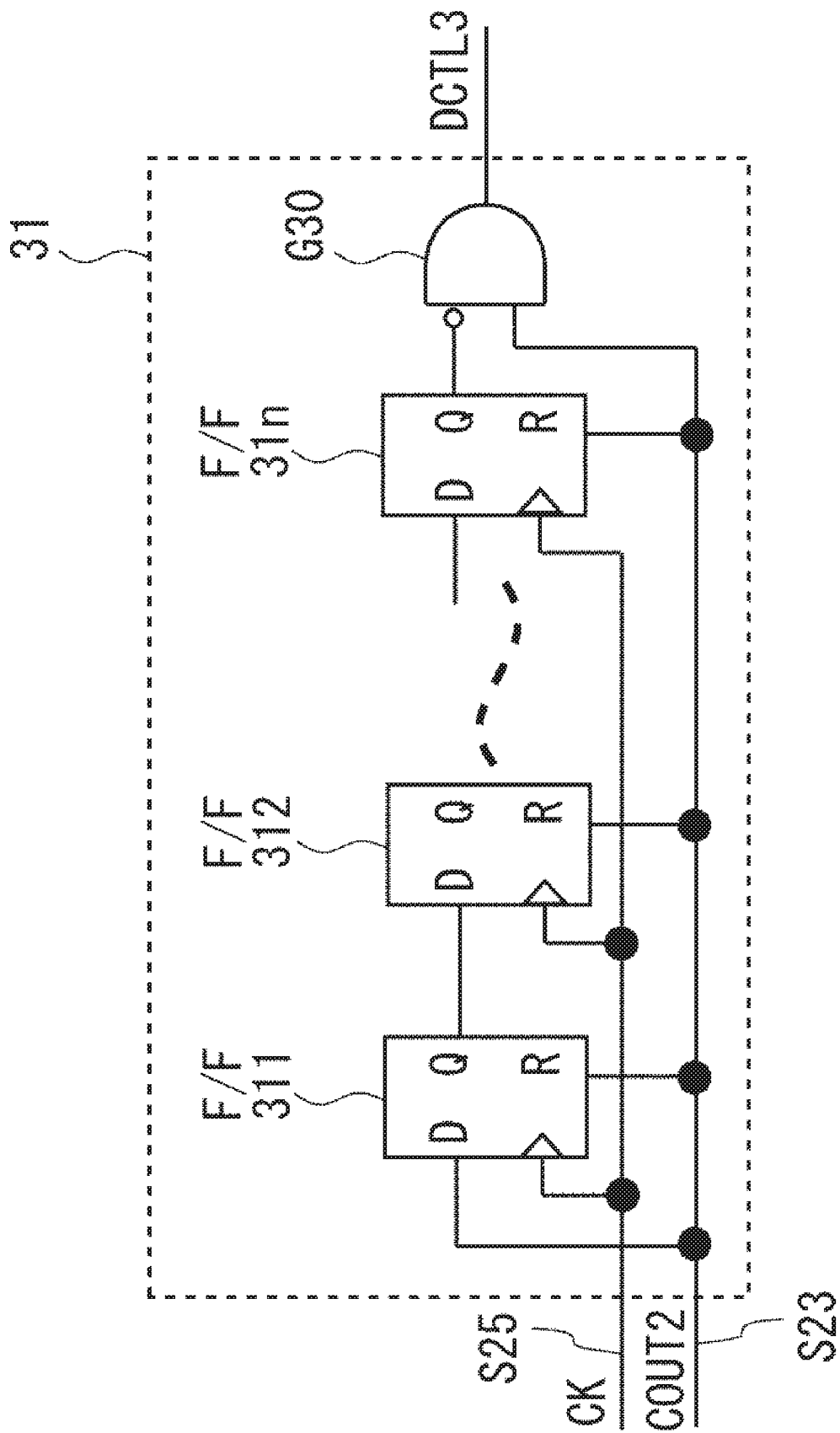
FIG. 3 is a configuration diagram illustrating a counter of a semiconductor device according to a first embodiment.

FIG. 3 is a configuration diagram illustrating a counter 31 of the semiconductor device 1 according to the first embodiment. As shown in FIG. 3, the counter 31 includes a plurality of n flip-flops (F/F) 311 to 31n and a logic gate circuit G30. The clock terminal of each F/F is connected to the signal line S25. As a result, the clock signal CK is input to the clock terminal of each F/F via the signal line S25. The R terminal of each F/F is connected to the signal line S23. The D terminal of the F/F 311 is connected to the signal line S23. The Q terminal of the F/F 311 is connected to the D terminal of the F/F 312. The Q terminal of the F/F 312 is connected to the D terminal of a F/F 313 (not shown). Hereinafter, the Q terminal of each (n−1)th F/F is connected to the D terminal of the n-th F/F. The Q terminal of the nth F/F is connected to one input terminal of the logic gate circuit G30. The other input terminal of the logic gate circuit G30 is connected to the signal line S23. The output terminal of the logic gate circuit G30 is connected to the gate of the transistor Q30. With such a configuration, the counter 31 has a function of counting a predetermined period. Accordingly, the counter 31 receives the comparison result signal COUT2 and the clock signal CK, counts the comparison result signal DCTL3 and the clock signal CK for a predetermined period of time with respect to the gate of the transistor Q30, and outputs an H level or an L level to the dummy control signal DCTL3.

Figure 4:
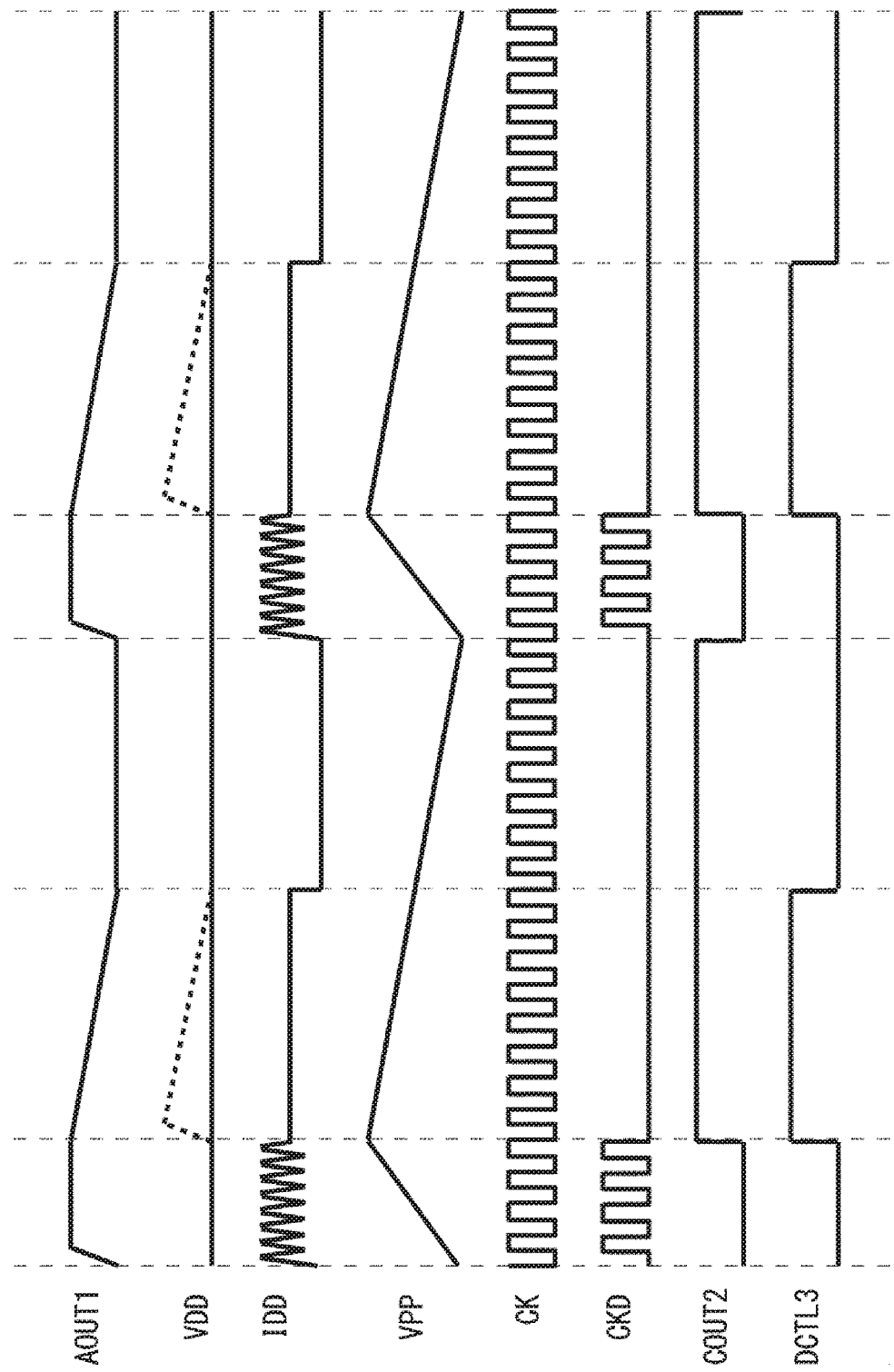
FIG. 4 is a graph illustrating an operational waveform of a semiconductor device according to an embodiment 1, wherein the horizontal axis represents time and the vertical axis represents the strength of the voltage or current.

Next, the operation of the semiconductor device 1 will be described. FIG. 4 is a graph showing an operation waveform of the semiconductor device 1 according to the first embodiment, in which the horizontal axis represents time and the vertical axis represents the intensity of voltage or current. The Oscillator 21 outputs the clock signal CK at regular intervals, for example. The driver 22 outputs a driver output signal CKD at a predetermined timing based on the clock signal CK.

The Booster stage 23 receives driver output signals CKD from the driver 22. The Booster stage 23 receives the driver output signal CKD and outputs the boosted voltage VPP using the internal voltage VDD. Here, during the operation in which the Booster stage 23 is boosting, the load current IDD is generated in the wire L10. As a result, the internal voltage VDD decreases. Therefore, the voltage divider 12 lowers the Voltage dividing level signal DIV1 in accordance with the lowering of the internal voltage VDD.

Accordingly, amplifier circuit 11 senses that the Voltage dividing level signal DIV1 is lower than the reference voltage VR1 and increases the amplified signal AOUT1. In the transistor Q10, gm rises as the AOUT1 of amplified signals connected to the gates rises. The transistor Q10 compensates for the load current IDD connected to the source, and suppresses a decrease in the internal voltage VDD.

Next, when the boosted voltage VPP continues to rise, the voltage divider 24 raises the Voltage dividing level signal DIV2 in accordance with the rise of the boosted voltage VPP. The comparator 25 detects that the Voltage dividing level signal DIV2 becomes higher than the reference voltage VR2, and outputs an H level to the comparison result signal COUT2. The driver 22 stops the oscillation of the driver output signal CKD in response to the comparison result signal COUT2.

The Booster stage 23 stops boosting in response to the stop of oscillation of the driver output signal CKD. Here, the load current IDD abruptly decreases in response to the stop of the boosting of the Booster stage 23. Since the Stabilized power supply circuit 10 cannot respond to a sudden change in loading and the gm of the transistor Q10 remains high, the internal voltage VDD rises as shown by the dotted line of VDD in FIG. 4.

However, when the counter 31 receives the enable signal of the comparative result signal COUT2, the clock signal CK counts the response rate time of the Stabilized power supply circuit 10. Then, the counter 31 outputs H level to the dummy control signal DCTL3 for a predetermined period. That is, the counter 31 counts and outputs the dummy control signal DCTL3 to be turned on for a predetermined period. The transistor Q30 allows at least a portion of the current IDD based on the internal voltage VDD to flow into the H level period of the dummy control signal DCTL3 input to the gate. For example, in the on state, the magnitude of the current IDD flowing in is substantially constant. The substantially constant value is a value that can be considered to be constant within the range of the measurement technique. As a result, it is possible to suppress the fluctuation of the internal voltage VDD. The predetermined time period is set based on the response time of the Stabilized power supply circuit 10 depending on the transconductance gm of the transistor Q10 in the Stabilized power supply circuit 10. That is, the rate of change of the amplified signal AOUT1 is set based on the rate of change of the transconductance gm of the transistor Q10.

Next, effects of the present embodiment will be described. The semiconductor device 1 of the present embodiment is controlled so that at least a part of the load current IDD flows into the Dummy load circuit 30 even if the load current IDD fluctuates due to repeat of the operation and stop of the Booster stage 23 of the Charge pump circuit 20 in the active state. As a result, it is possible to suppress the fluctuation of the internal voltage VDD.

The Dummy load circuit 30 receives the comparison result signals COUT2 outputted from the comparator 25. Therefore, it is possible to quickly respond to a change in the boosted voltage VPP. Therefore, it is possible to quickly suppress the fluctuation of the internal voltage VDD.

The Charge pump circuit 20 has a configuration that can cope with the boosting of either the positive electrode or the negative electrode. As a result, the versatility of the semiconductor device 1 can be improved. When applied to the semiconductor memory device including the Memory circuit 40, since the boosted voltage VPP generated from the internal voltage VDD is also stably generated, the operation such as reading and writing can be stabilized.

Figure 5:
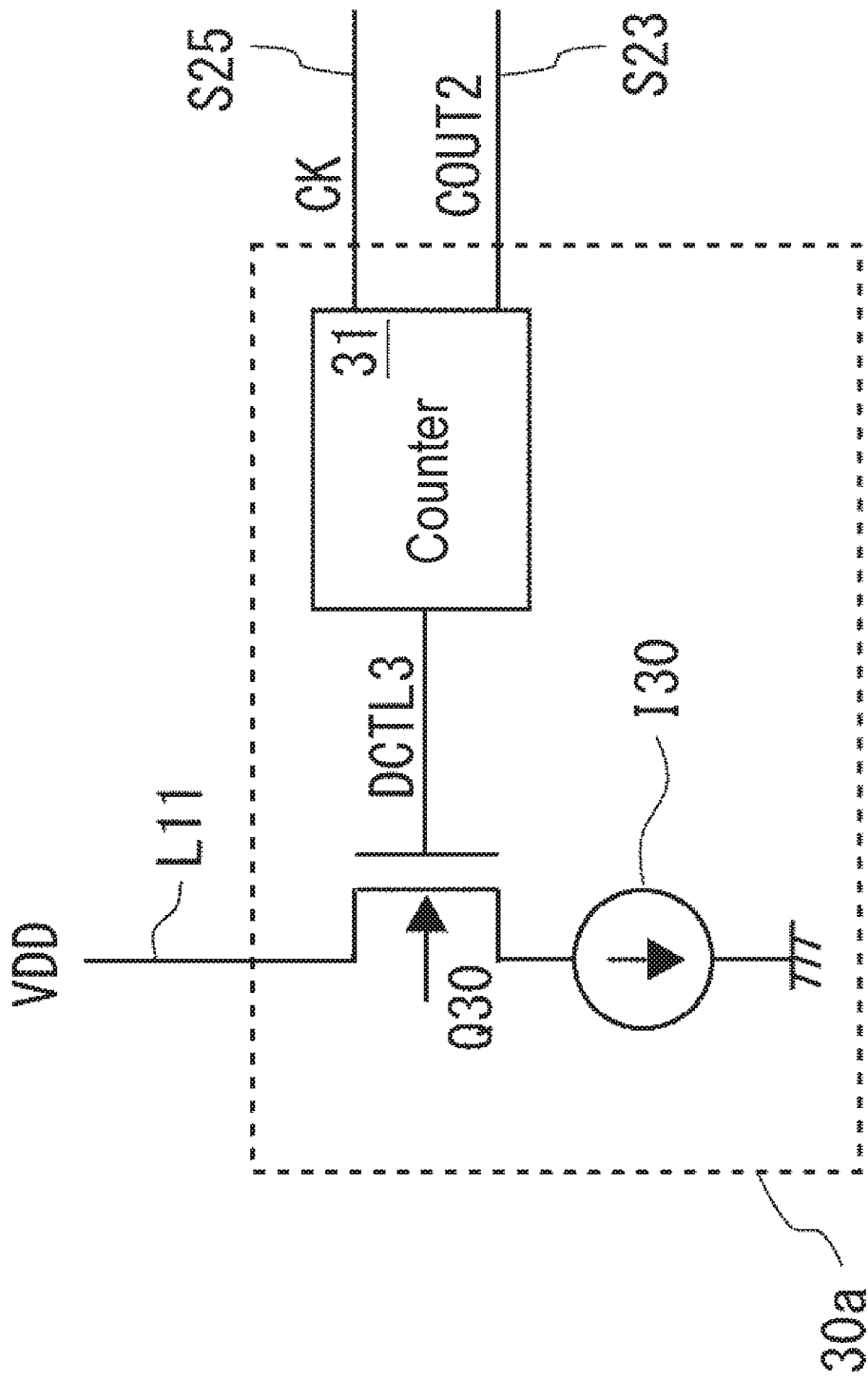
FIG. 5 is a configuration diagram illustrating a Dummy load circuit of a semiconductor device according to a second embodiment.

Next, a semiconductor device according to Embodiment 2 will be described. The semiconductor device of the second embodiment differs from the semiconductor device 1 of the first embodiment in the configuration of the Dummy load circuit 30a. FIG. 5 is a configuration diagram illustrating a Dummy load circuit 30a of the semiconductor device according to the second embodiment.

As shown in FIG. 5, the Dummy load circuit 30a includes a counter 31, a transistor Q30, and a current source 130. One end of the current source 130 is grounded, and the other end is connected to the source of the transistor Q30. That is, the current source 130 is disposed between the source of the transistor Q30 and the ground. The current source 130 sets the current IDD flowing into the transistor Q30 to a constant value. Other configurations are the same as those of the first embodiment.

The counter 31 receives the enable signal of the comparison result signal COUT2, and counts the clock signal CK for the response time of the Stabilized power supply circuit 10. Then, the counter 31 outputs H level to the dummy control signal DCTL3 for a predetermined period of time. The transistor Q30 is turned on during the H level period of the dummy control signal DCTL3. Therefore, the transistor Q30 controls the gate so that at least a part of the current IDD based on the internal voltage VDD flows in. By supplying a stable current by the current source 130, it is possible to suppress the variation of the internal voltage VDD.

In the semiconductor device of the second embodiment, since the Dummy load circuit 30a uses the current source 130, the current IDD flowing into the transistor Q30 can be kept constant. This makes it possible to suppress the fluctuation of the internal voltage VDD with high accuracy. Other effects are included in the description of Embodiment 1.

Figure 6:
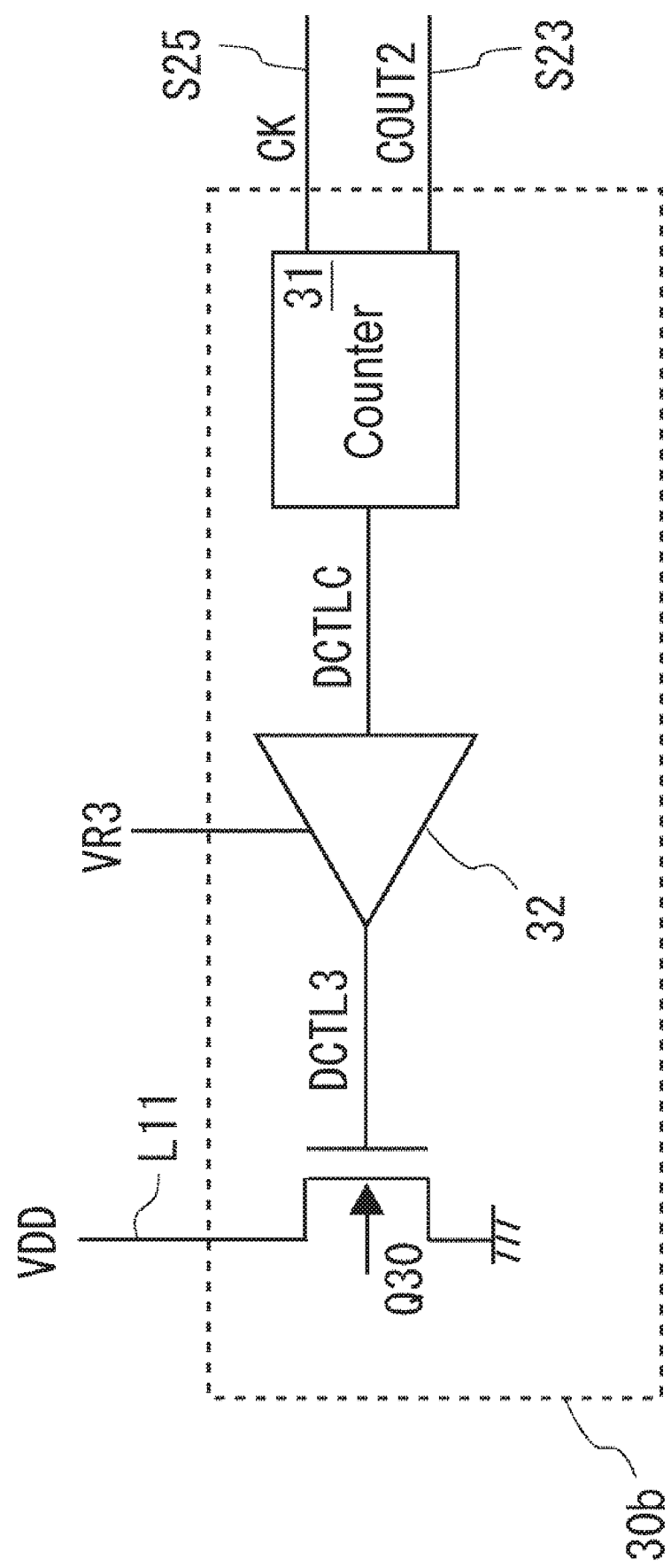
FIG. 6 is a configuration diagram illustrating a Dummy load circuit of a semiconductor device according to a third embodiment.

Next, a semiconductor device according to Embodiment 3 will be described. The semiconductor device of Embodiment 3 differs from the semiconductor devices of Embodiments 1 and 2 in the configuration of the Dummy load circuit 30b. FIG. 6 is a configuration diagram illustrating a Dummy load circuit of the semiconductor device according to the third embodiment.

As shown in FIG. 6, the Dummy load circuit 30b includes a counter 31, a level shifter 32, and a transistor Q30. The level shifter 32 is disposed between the counter 31 and the gate of the transistor Q30. That is, the input terminal of the level shifter 32 is connected to the counter 31, and the output terminal of the level shifter 32 is connected to the gate of the transistor Q30.

The counter 31 receives the enable signal of the comparison result signal COUT2, counts the clock signal CK for the response time of the Stabilized power supply circuit 10, and outputs the clock signal CK to the counter output signal DCTLC for a predetermined period of time. The counter 31 outputs the counter output signal DCTLC to the level shifter 32. The level shifter 32 converts the level of the counter output signal DCTLC of the H level by using the constant voltage VR3. The level shifter 32 outputs the dummy control signal DCTL3 to the transistor Q30. As a result, the level shifter 32 applies a constant voltage to the gate of the transistor Q30. Transistor Q30 is turned on during the H level of the dummy control signal DCTL3 connected to the gate. As a result, the current IDD flowing into the transistor Q30 becomes constant. Therefore, the internal voltage VDD can be stabilized.

In the semiconductor device according to the third embodiment, since the level shifter 32 using the constant voltage power supply VR3 as a power supply is used, the current IDD based on the internal voltage VDD can be kept constant, and the variation of the internal voltage VDD can be suppressed with high accuracy. Other effects are described in Embodiments 1 and 2.

Figure 7:
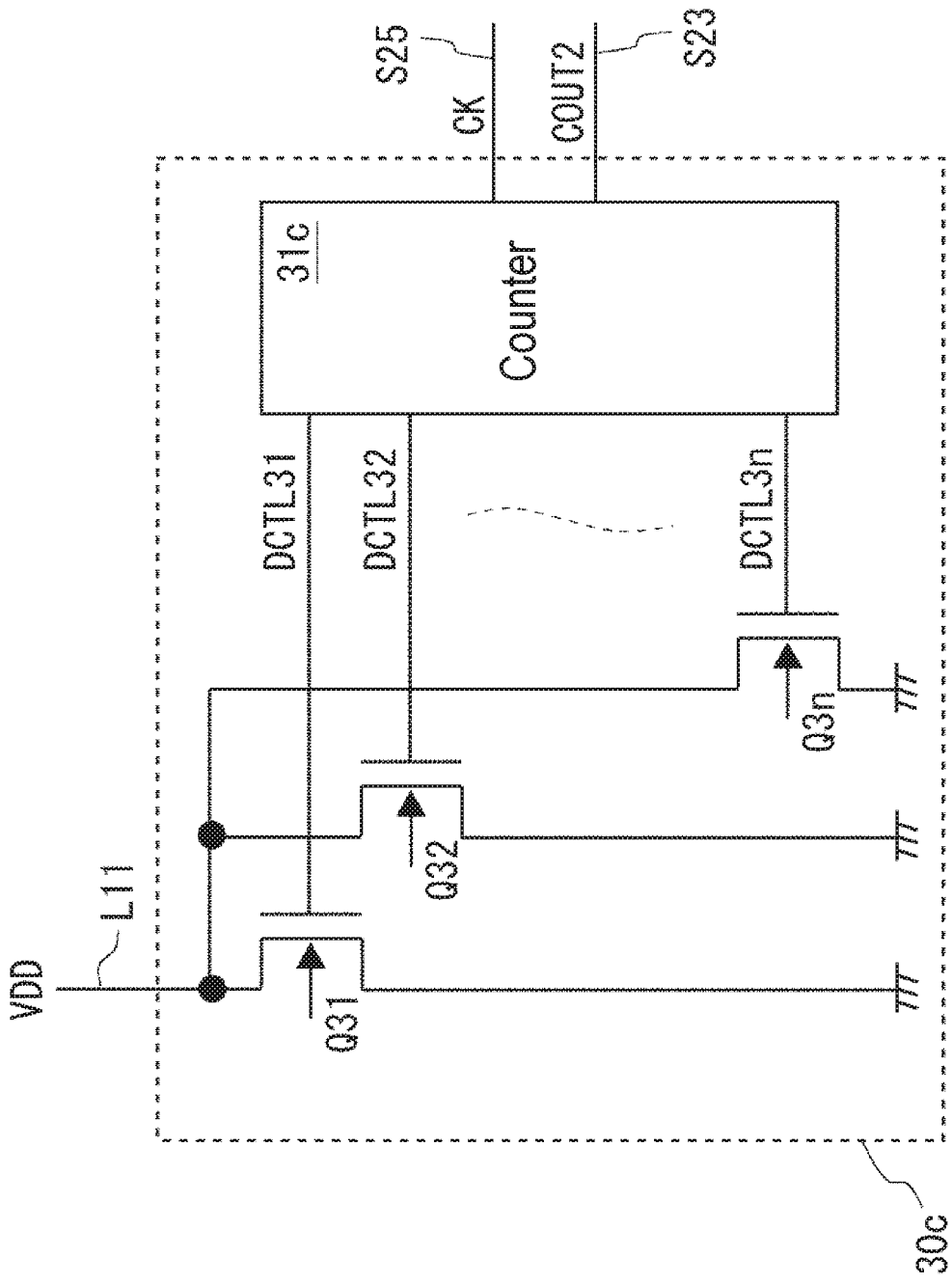
FIG. 7 is a configuration diagram illustrating a Dummy load circuit of a semiconductor device according to an embodiment 4.

Next, a semiconductor device according to Embodiment 4 will be described. The semiconductor device of Embodiment 4 differs from the semiconductor devices of Embodiments 1 to 3 in the configuration of the Dummy load circuit 30c. FIG. 7 is a configuration diagram illustrating a Dummy load circuit of the semiconductor device according to the fourth embodiment.

As shown in FIG. 7, the Dummy load circuit 30c includes a counter 31c and a plurality of n transistors Q31 to Q3n. The gate of each transistor is connected to the counter 31c. The drain of each transistor is connected to the wiring L10 via the wiring L11. The source of each transistor is grounded. As described above, the plurality of transistors Q31 to Q3n are connected in parallel to the counter 31c.

Figure 8:
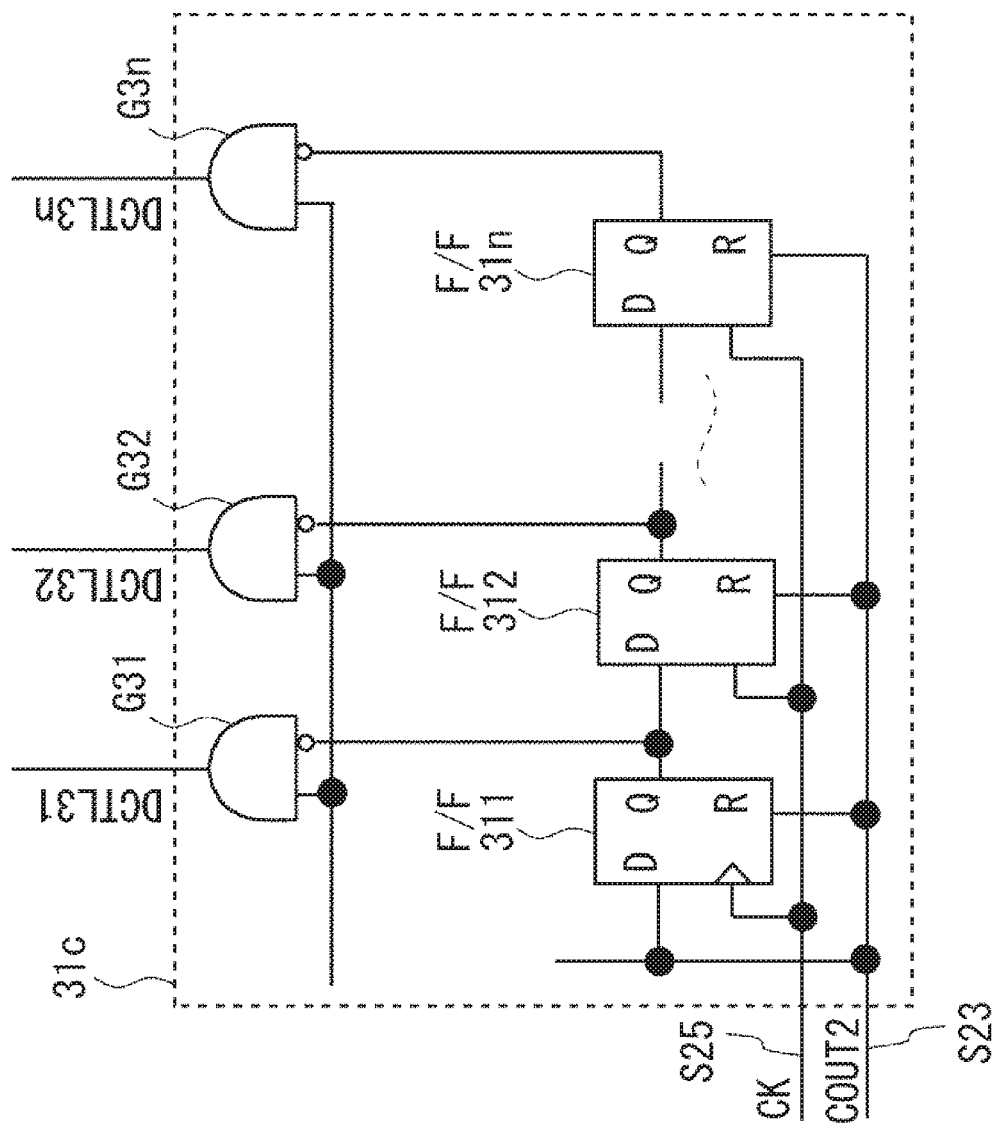
FIG. 8 is a configuration diagram illustrating a counter of the semiconductor device according to the fourth embodiment.

FIG. 8 is a configuration diagram illustrating a counter 31c of the semiconductor device according to the fourth embodiment. As shown in FIG. 8, the counter 31c includes a plurality of n pieces of F/F 311 to 31n and n pieces of logical gate circuits G31 to 3n. The clock terminal of each F/F is connected to the signal line S25. As a result, the clock signal CK is input to the clock terminal of each F/F via the signal line S25. The R terminal of each F/F is connected to the signal line S23.

The D terminal of the F/F 311 is connected to the signal line S23. The Q terminal of the F/F 311 is connected to the D terminal of the F/F 312 and to one terminal of the logic-gate circuit G31. The Q terminal of the F/F 312 is connected to the D terminal of the F/F 313 (not shown) and to one terminal of the logic-gate circuit G32. Hereinafter, the Q terminal of each (n−1)th F/F is connected to the D terminal of the n-th F/F, and is also connected to one terminal of the logic gate circuit Q3n. The Q terminal of the nth F/F is connected to one terminal of the logic gate circuit G3n. In this manner, the logic gate circuits G31 to 3n are connected to the logic gate circuits F/F 311 to 31n. The other terminals of the logic gate circuits G31 to G3n are connected to the signal line S23.

The counter 31c receives the comparison result signal COUT2 and the clock signal CK, counts the comparison result signal DCTL31~3n and the clock signal CK for a plurality of dummy control signals DCTL31~3n for different times, and outputs the counted comparison result signal DCTL31~3n and the clock signal CK to the plurality of dummy control signals COUT2. For example, the counter 31c counts and outputs the H level dummy control signal DCTL32 output to the transistor Q32 for a period longer than the H level dummy control signal DCTL31 output to the transistor Q31. As a result, the Dummy load circuit 30c receives the dummy control signals DCTL31~3n and controls the current IDD to flow in the dummy control signals DCTL31~3n for the different periods.

Figure 9:
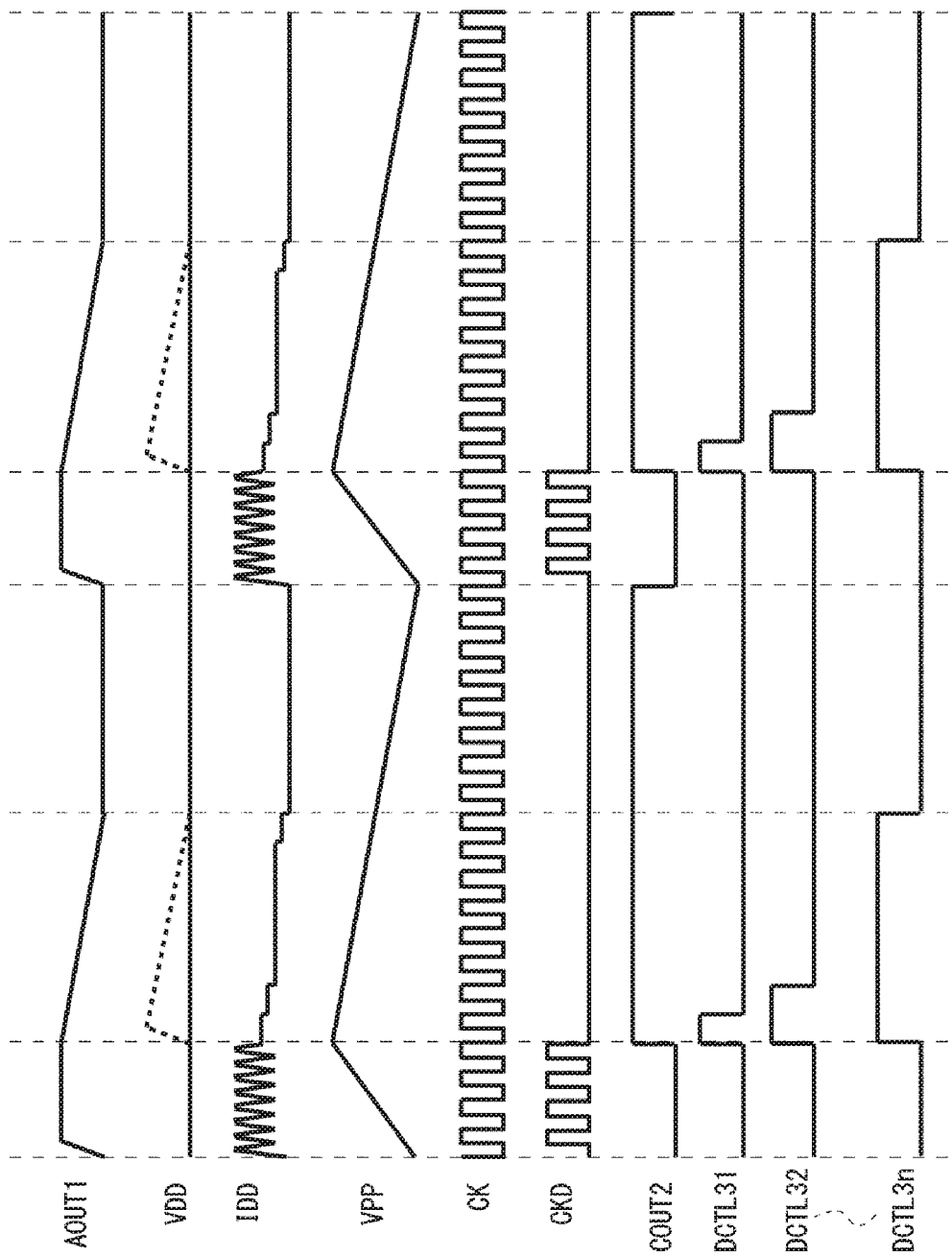
FIG. 9 is a graph illustrating an operational waveform of a semiconductor device according to embodiment 4, wherein the horizontal axis represents time and the vertical axis represents the strength of the voltage or current.

FIG. 9 is a graph illustrating an operation waveform of the semiconductor device according to the fourth embodiment, in which the horizontal axis represents time and the vertical axis represents the intensity of voltage or current. As shown in FIG. 9, the Charge pump circuit 20 outputs the boosted voltage VPP by the operation of the drivers 22 and the Booster stage 23 in the Charge pump circuit 20, and accordingly, the Stabilized power supply circuit 10 compensates for the load current IDD to suppress the decrease of the internal voltage VDD, similarly to the first embodiment.

The comparator 25 in the Charge pump circuit 20 stops boosting the Booster stage 23 when the boosted voltage VPP rises to be higher than a predetermined voltage, whereby the load current IDD abruptly decreases, and the internal voltage VDD rises as shown by the dotted line of VDD in FIG. 9, similarly to the first embodiment.

In the present embodiment, a plurality of dummy control signals DCTL31~3n are output at H level for a predetermined period by using the outputs of the plurality of F/F 311 to 31n. The H level periods of the dummy control signals DCTL31~3n differ. For example, the counter 31c counts and outputs the H period of the dummy control signal DCTL32 output to the transistor Q32 for a period longer than the H period of the dummy control signal DCTL31 output to the transistor Q31. Therefore, the H level of the respective dummy control signals DCTL31~3n transitions to the L level in a stepwise manner. Each of the transistors Q31 to Q3n feeds a current IDD based on the internal voltage VDD corresponding to the H level period of each of the dummy control signals DCTL31~3n. Therefore, the current IDD flowing into the Dummy load circuit 30c changes in a stepwise manner. That is, in the on-state of the Dummy load circuit 30c, the magnitude of the current IDD flowing into the Dummy load circuit 30c changes stepwise.

In the semiconductor device of the fourth embodiment, since the transistors Q31 to 3n are turned off in stages, the current IDD can be changed in stages. As a result, the rate of change of gm of the transistor Q10 can be made to follow the rate of change of the amplified signal AOUT1. Therefore, it is possible to suppress the fluctuation of the internal voltage VDD with high accuracy. Other effects are included in the description of Embodiments 1 to 3.

Figure 10:
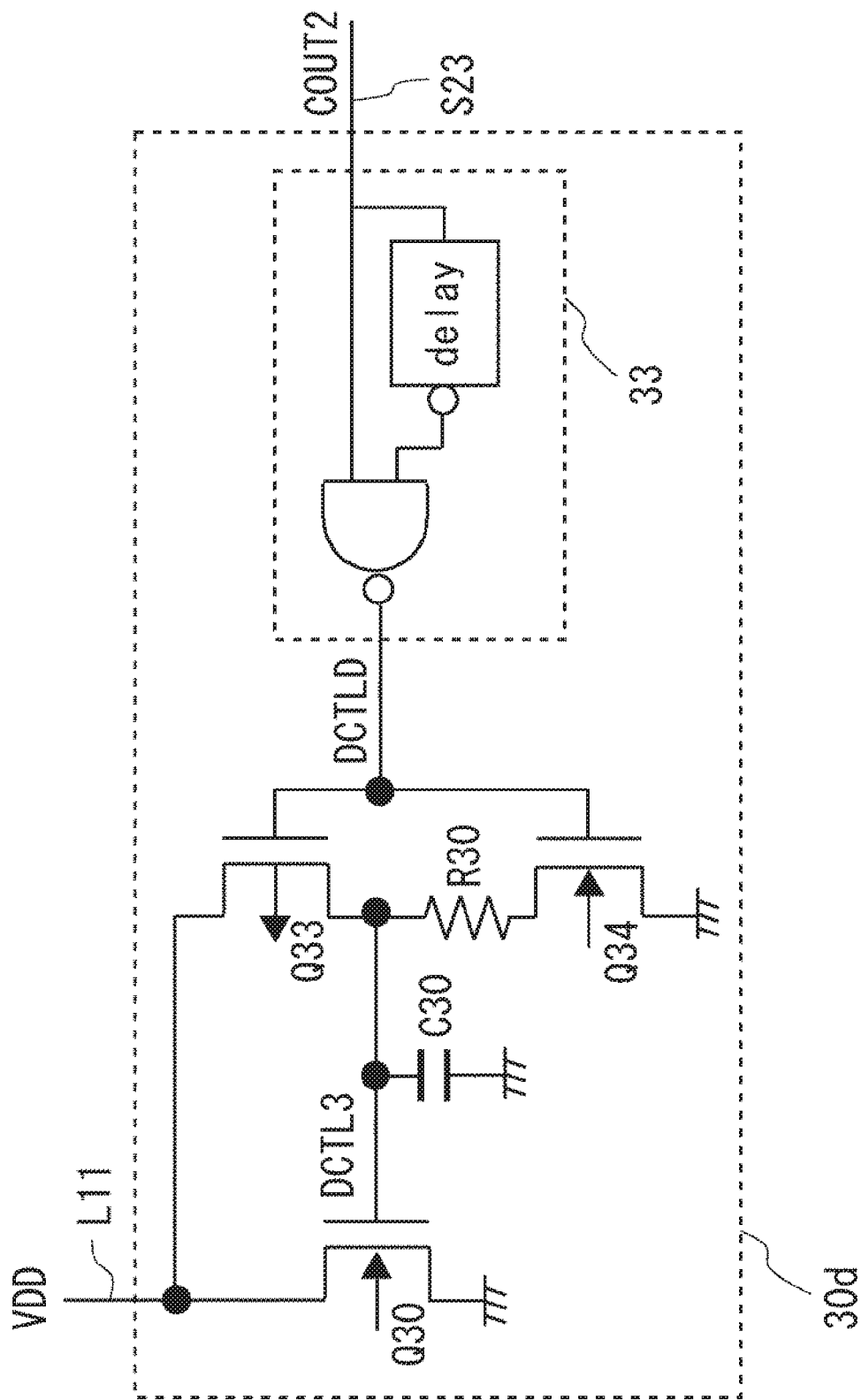
FIG. 10 is a circuit diagram illustrating a Dummy load circuit of a semiconductor device according to an embodiment 5.

Next, a semiconductor device according to Embodiment 5 will be described. The semiconductor device of Embodiment 5 differs from the semiconductor devices of Embodiments 1 to 4 in the configuration of the Dummy load circuit 30d. FIG. 10 is a circuit diagram illustrating a Dummy load circuit 30d of the semiconductor device according to the fifth embodiment.

As shown in FIG. 10, the Dummy load circuit 30d includes a one-shot pulse generator 33, transistors Q30, Q33, and Q34, a resistive element R30, and a capacitive element C30. The one-shot pulse generating circuit 33 is a circuit for generating one pulse. The one-shot pulse generating circuit 33 includes, for example, a delay circuit and a NAND Logic circuit. The one-shot pulse generator 33 receives the comparison result signal COUT2 and outputs a one-shot pulse signal DCTLD. More specifically, the comparing result signal COUT2 is input to the input terminal of the one-shot pulse generating circuit 33, and the one-shot pulse signal DCTLD is output from the output terminal of the one-shot pulse generating circuit 33.

The transistor Q30 is, for example, an N-type channel transistor. The source of the transistor Q30 is grounded. The drain of the transistor Q30 is connected to a wiring L10 connecting the Stabilized power supply circuit 10 and the Charge pump circuit 20 via a wiring L11. The gate of the transistor Q30 is connected to one end of the capacitor C30 and one end of the resistor R30. The transistor Q30 receives the dummy control signal DCTL3 and causes a current IDD to flow in the dummy control signal DCTL3.

The transistor Q33 is, for example, a P-type channel transistor. The source of the transistor Q33 is connected to the wiring L11. The drain of the transistor Q33 is connected to one end of the resistive element R30. The gate of the transistor Q33 is connected to the output terminal of the one-shot pulse generating circuit 33. The transistor Q33 receives the one-shot pulse signal DCTLD and outputs an H level signal for turning on the Dummy load circuit 30d to the dummy control signal DCTL3. The transistor Q34 is, for example, an N-type channel transistor. The drain of the transistor Q34 is connected to the other end of the resistive element R30. The source of the transistor Q34 is grounded. The gate of the transistor Q34 is also connected to the output terminal of the one-shot pulse generating circuit 33.

One end of the resistive element R30 is connected to the drain of the transistor Q33, and the other end of the resistive element R30 is connected to the drain of the transistor Q34. One end of the capacitor C30 is connected to the gate of the transistor Q30, one end of the resistor R30, and the drain of the transistor Q33. The other end of the capacitive element C30 is grounded. The transistor Q34 is connected to the capacitive element C30 via the resistive element R30, and reduces the dummy control signal DCTL3 so as to have a time constant.

Figure 11:
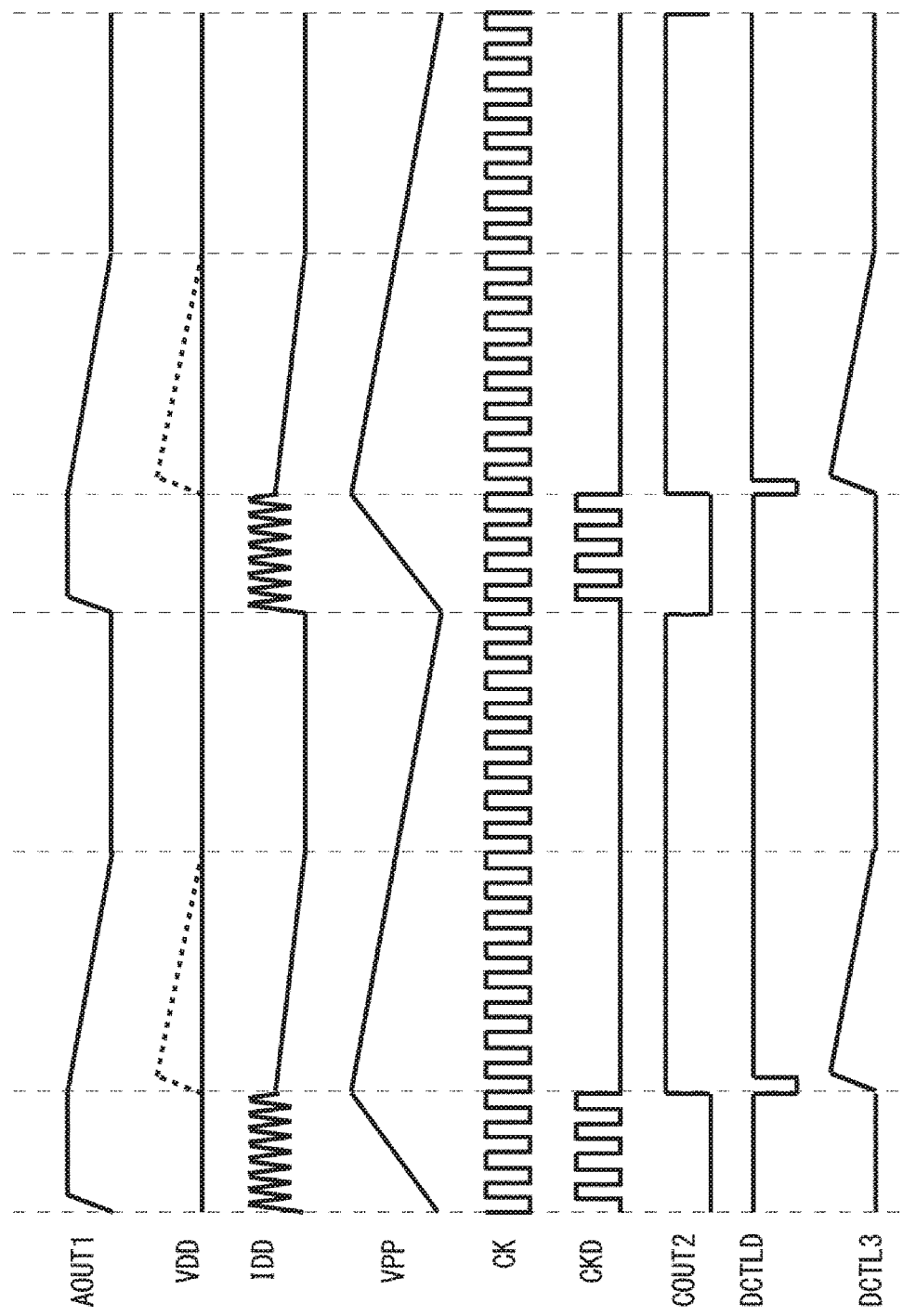
FIG. 11 is a graph illustrating an operational waveform of a semiconductor device according to an embodiment 5, wherein the horizontal axis represents time and the vertical axis represents the strength of the voltage or current.

FIG. 11 is a graph illustrating an operation waveform of the semiconductor device according to the fifth embodiment, in which the horizontal axis represents time and the vertical axis represents the intensity of voltage or current. As shown in FIG. 11, the Charge pump circuit 20 outputs the boosted voltage VPP by the operation of the drivers 22 and the Booster stage 23 in the Charge pump circuit 20, and accordingly, the Stabilized power supply circuit 10 compensates for the load current IDD to suppress the decrease of the internal voltage VDD, similarly to the first embodiment.

The comparator 25 in the Charge pump circuit 20 stops boosting the Booster stage 23 when the boosted voltage VPP rises to be higher than a predetermined voltage, whereby the load current IDD rapidly decreases, and the internal voltage VDD rises as it is, similarly to the first embodiment.

The one-shot pulse generator 33 receives the comparison result signal COUT2, and outputs an L level signal to the one-shot pulse signal DCTLD for a short time corresponding to one shot. The transistor Q33 outputs a dummy control signal DCTL3 as an H level during the L level period of the one-shot pulse signal DCTLD connected to the gate. Then, for example, the capacitor C30 is charged with H level. During the H level period of the dummy control signal DCTL3, the transistor Q30 is turned on, and the current IDD based on the internal voltage VDD flows in. As a result, it is possible to suppress the fluctuation of the internal voltage VDD.

When the one-shot pulse signal DCTLD transitions to H level, the transistor Q34 is turned on, and starts to pull out the charged dummy control signal DCTL3. The resistive element R30 and the capacitive element C30 change the dummy control signal DCTL3 to L level by time constants set so as to correspond to the response time of the Stabilized power supply circuit 10.

In the fifth embodiment, the gate potential of the transistor Q30 decreases with a time constant. Therefore, the current IDD based on the internal voltage VDD changes in an analog manner. That is, in the on-state of the Dummy load circuit 30d, the magnitude of the current IDD fluctuates so as to have time constants. This makes it possible to follow the rate of change of gm of the transistor Q10 with respect to the rate of change of the amplified signal AOUT1, and to suppress the variation of the internal voltage VDD with high accuracy.

Figure 12:
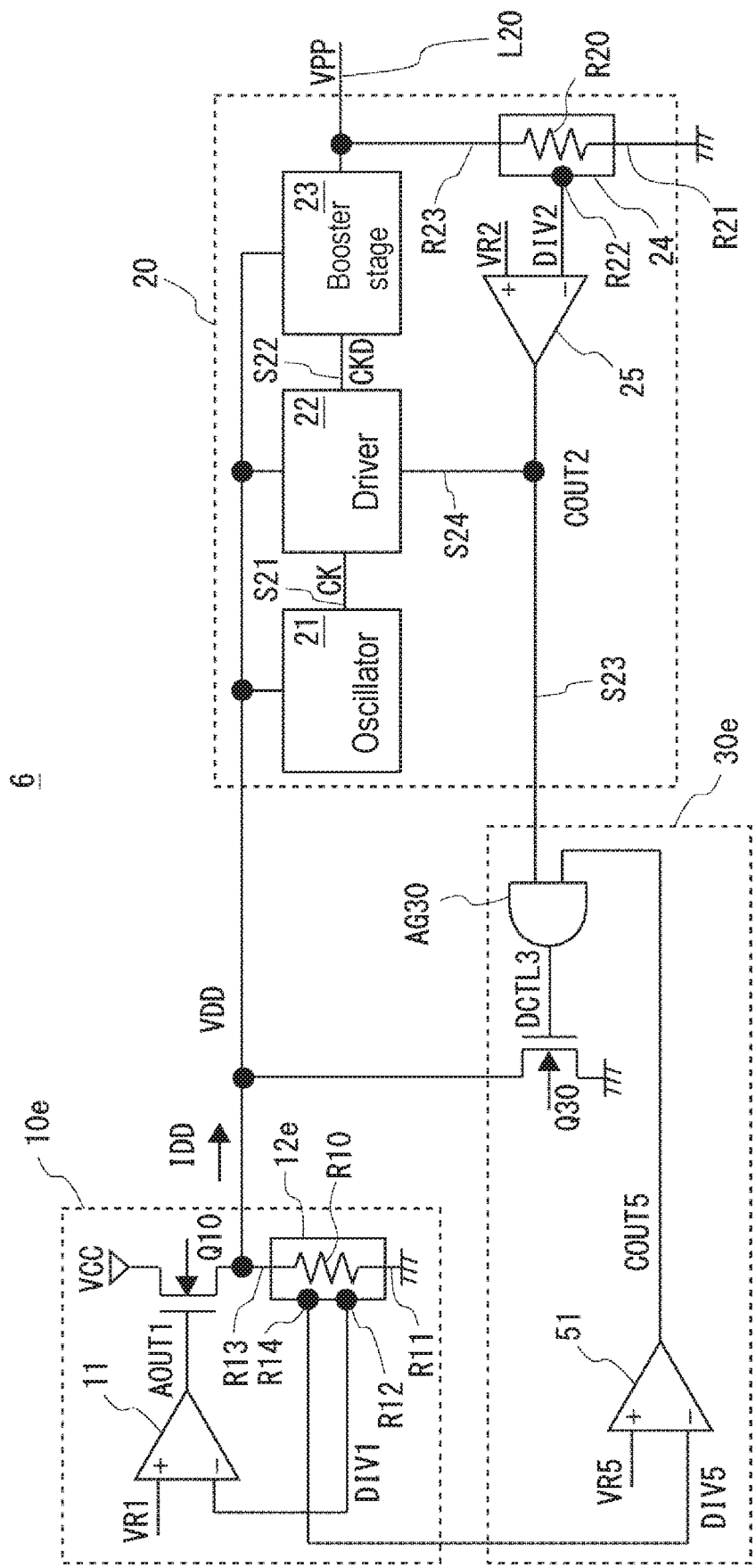
FIG. 12 is a configuration diagram illustrating a Stabilized power supply circuit, a Charge pump circuit, and a Dummy load circuit of a semiconductor device according to an embodiment 6

Next, a semiconductor device according to an embodiment 6 will be described. The semiconductor device of Embodiment 6 differs from the semiconductor devices of Embodiments 1 to 5 in the configurations of the Stabilized power supply circuit 10e and the Dummy load circuit 30e. FIG. 12 is a circuit diagram illustrating the Stabilized power supply circuit 10e, the Charge pump circuit 20, and the Dummy load circuit 30e of the semiconductor device 6 according to the sixth embodiment.

As shown in FIG. 12, the Stabilized power supply circuit 10e of the sixth embodiment includes an amplifier circuit 11, a transistor Q10, and a voltage divider circuit 12e. The structures of the amplifier 11 and the transistor Q10 in the Stabilized power supply circuit 10e are the same as those in the first embodiment. The configuration of the terminal R11, the terminal R12, and the terminal R13 of the voltage dividing circuit 12e is the same as that of the first embodiment. However, the voltage dividing circuit 12e further has a variable terminal R14. The voltage dividing circuit 12e is also referred to as a power supply voltage dividing circuit 12e.

The Charge pump circuit 20 includes a Oscillator 21, a driver 22, a Booster stage 23, a voltage divider circuit 24, and a comparator circuit 25, which are the same as those in the first embodiment. The clock signal CK is different from the first embodiment in that the signal line S25 connected from the Oscillator 21 to the Dummy load circuit 30e is not provided and the clock signal CK is not outputted to the Dummy load circuit 30e.

The Dummy load circuit 30e includes a comparator 51, a AND Logic circuit AG30, and a transistor Q30.

The comparison circuit 51 has a non-inverting input terminal, an inverting input terminal, and an output terminal. The reference voltage VR5 is input to the non-inverting input terminal of the comparator 51. The inverting input terminal of the comparison circuit 51 is connected to the variable terminal R14 of the variable resistor R10 of the voltage dividing circuit 12e. As a result, the Voltage dividing level signal DIV5 is input to the inverting input terminal of the comparator 51. An output terminal of the comparator 51 is connected to one input terminal of the AND Logic circuit AG30. The comparator 51 compares the reference voltage VR5 with the Voltage dividing level signal DIV5. The comparator 51 outputs the comparison result signal COUT5 to one input terminal of the AND Logic circuit AG30. The comparison circuit 51 is also referred to as a dummy comparison circuit 51.

The other input terminal of the AND Logic circuit AG30 is connected to the output terminal of the comparator 25 via the signal line S23. The comparison result signal COUT2 is input to the other input terminal of the AND Logic circuit AG30 via the signal line S23. The output terminal of the AND Logic circuit AG30 is connected to the gate of the transistor Q30. The AND Logic circuit AG30 receives the comparison result signal COUT2 and the comparison result signal COUT5, and outputs the dummy control signal DCTL3 to the gates of the transistors Q30. Comparison result signal COUT5 is based on Voltage dividing level signal DIV5.

Figure 13:
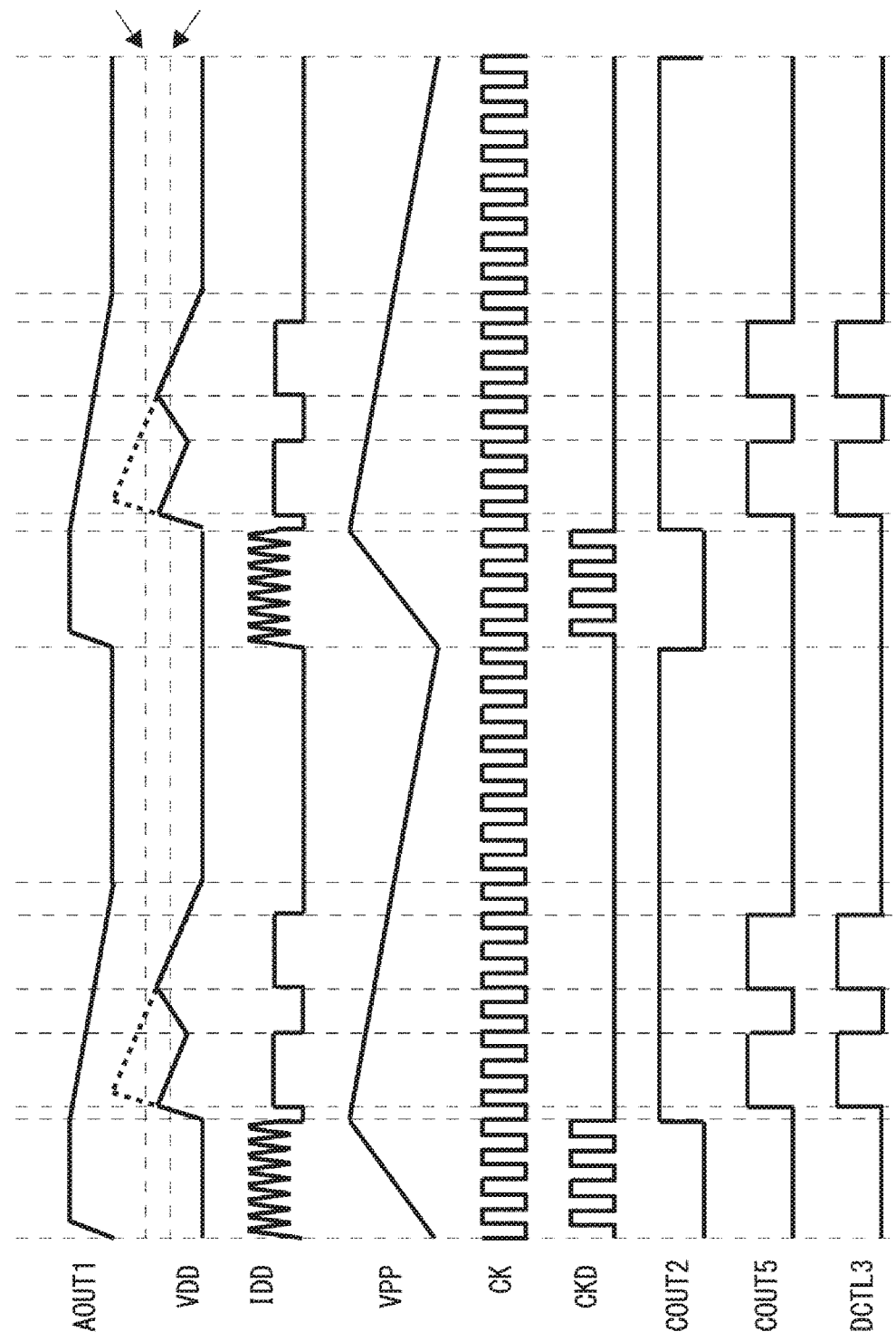
FIG. 13 is a graph illustrating an operational waveform of a semiconductor device according to embodiment 6, wherein the horizontal axis represents time and the vertical axis represents the strength of the voltage or current.
Figure 14:
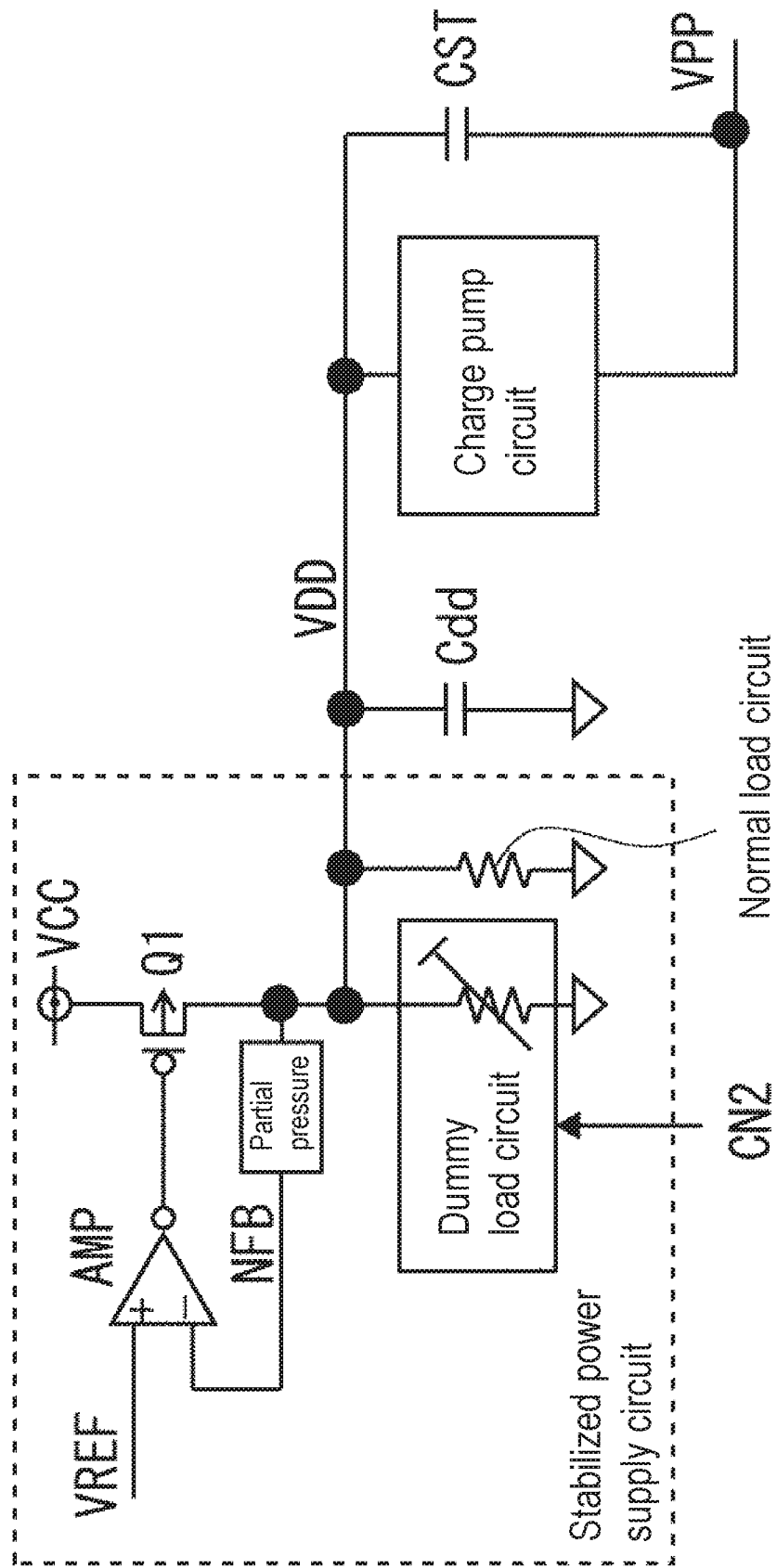
FIG. 14 is a configuration diagram illustrating a Stabilized power supply circuit.

The transistor Q30 receives the dummy control signal DCTL3 and causes a current IDD based on the internal voltage VDD to flow in the dummy control signal DCTL3. FIG. 13 is a graph illustrating an operation waveform of the semiconductor device according to the sixth embodiment, in which the horizontal axis represents time and the vertical axis represents the intensity of voltage or current. As shown in FIG. 13, the Charge pump circuit 20 outputs the boosted voltage VPP by the operation of the drivers 22 and the Booster stage 23 in the Charge pump circuit 20, and accordingly, the Stabilized power supply circuit 10 compensates for the load current IDD to suppress the decrease of the internal voltage VDD, similarly to the first embodiment.

The comparator 25 in the Charge pump circuit 20 stops boosting the Booster stage 23 when the boosted voltage VPP rises to be higher than a predetermined voltage, whereby the load current IDD rapidly decreases, and the internal voltage VDD rises as it is, similarly to the first embodiment.

In the present embodiment, when the boosted voltage VPP continues to rise, the voltage divider 24 raises the Voltage dividing level signal DIV2 in accordance with the rise of the boosted voltage VPP. The comparator 25 detects that the Voltage dividing stop signal DIV2 becomes higher than the reference voltage VR2, and outputs an H level to the comparison result signal COUT2.

The voltage divider 12 raises the Voltage dividing level signal DIV5 in accordance with the rise of the internal voltage VDD. The comparator 51 detects that the Voltage dividing level signal DIV5 becomes higher than the reference voltage VR5, and outputs an H level to the comparison result signal COUT5. The transition of the comparison result signal COUT5 to the H level is different from the transition of the comparison result signal COUT2 to the H level.

The AND Logic circuit AG30 outputs the H level to the dummy control signal DCTL3 according to the H level of the comparison result signal COUT2 and the H level of the comparison result signal COUT5. The transistor Q30 is turned on during the H level of the dummy control signal DCTL3 connected to the gate, and a current IDD based on the internal voltage VDD flows.

When the internal voltage VDD becomes the detected level, the reference voltage VR5 is set so that the comparison result signal COUT5 becomes the H level. As a result, the internal voltage VDD can be set within a predetermined detection level range. Then, the detection level is set to be smaller than the absolute maximum rating. In this manner, the variation of the internal voltage VDD can be suppressed more than the absolute maximum rating.

In the present embodiment, by setting the detection level of the internal voltage VDD to be lower than the absolute maximum rating, it is possible to suppress an increase in the internal voltage VDD with high accuracy.

What is claimed is:

1. A semiconductor device comprising:
   a stabilized power supply circuit that generates a first voltage;
   a charge pump circuit that generates a second voltage using the first voltage, compares the second voltage with a reference voltage, and outputs a comparison result signal; and
   a dummy load circuit that is controlled to be in an on-state or an off-state in response to the comparison result signals,
   wherein the stabilized power supply circuit provides at least a portion of a current based on the first voltage to the dummy load circuit in an on-state of the semiconductor device,
   wherein the charge pump circuit includes a voltage divider that outputs a voltage dividing level signal in response to changes of the second voltage, and
   wherein the charge pump circuit compares the second voltage to a reference voltage via the voltage dividing level signal.

2. The semiconductor device according to claim 1, further comprising:
   a memory circuit operating at said second voltage.

3. A semiconductor device comprising:
   a stabilized power supply circuit that generates a first voltage;
   a charge pump circuit that generates a second voltage using the first voltage, compares the second voltage with a reference voltage, and outputs a comparison result signal; and
   a dummy load circuit that is controlled to be in an on-state or an off-state in response to the comparison result signals,
   wherein the stabilized power supply circuit provides at least a portion of a current based on the first voltage to the dummy load circuit in an on-state of the semiconductor device,
   wherein the charge pump circuit further comprises an oscillator that oscillates a clock signal, and
   wherein the dummy load circuit is controlled to be in the on-state or the off-state upon receiving the clock signal in addition to the comparing result signal.

4. The semiconductor device according to claim 3, wherein the charge pump circuit further comprises:
   a driver that is controlled to output a driver output signal in response to the clock signal and the comparison result signal; and
   a booster stage generates the second voltage using the first voltage in response to receive the driver output signal.

5. The semiconductor device according to claim 3,
   wherein the dummy load circuit comprises a counter that 1) receives the comparison result signal and the clock signal and 2) counts and outputs a dummy control signal to be turned on, and
   wherein an inflow transistor receives the dummy control signal and causes a part of the dummy control signal to flow in.

6. The semiconductor device according to claim 5, wherein the counter includes a plurality of flip-flops and logic-gate circuits.

7. The semiconductor device according to claim 5, wherein a magnitude of the portion is a substantially constant value in the on-state.

8. The semiconductor device according to claim 7, wherein the dummy load circuit comprises a current source that causes the portion flowing into the inflow transistor to be the substantially constant value.

9. The semiconductor device according to claim 7, wherein the dummy load circuit includes a level shifter that applies a constant voltage to a gate of the inflow transistor.

10. The semiconductor device according to claim 3, wherein the dummy load circuit includes:
   a counter that receives the comparison result signal and the clock signal and counts and outputs a plurality of dummy control signal which is turned on for mutually different periods of time; and
   a plurality of inflow transistors connected in parallel to the counter, and
   wherein the dummy load circuit is controlled to receive the dummy control signals and cause the portion to flow in for each of the differing periods of time.

11. The semiconductor device according to claim 10, wherein the counter includes a plurality of flip-flops and a plurality of logic circuit connected to each of the flip-flops.

12. The semiconductor device according to claim 10, wherein a magnitude of the portion changes in a stepwise manner in the on-state.

13. The semiconductor device according to claim 1, wherein the stabilized power supply circuit comprises:
   a power supply transistor in which an external power supply is connected to one of a source and a drain;
   a dividing circuit for a power supply having a variable resistor, one end of which is connected to an other end of the power supply transistor and the other end of which is grounded,
   an amplifier circuit including:
      a non-inverting input terminal to which a reference voltage for power supply is input, and
      an inverting input terminal connected to a terminal for varying a voltage divider circuit for power supply, and an output terminal connected to a gate of the power supply transistor, and
   wherein a predetermined time period is set based on a response time of the stabilized power supply circuit depending on a transconductance of the power supply transistor.

14. The semiconductor device according to claim 1, wherein the dummy load circuit further comprises:
   a one-shot pulse generating circuit that receives the comparison result signal and outputs a one-shot pulse signal,
   a first transistor that receives the one-shot pulse signal and outputs a dummy control signal for turning on the one-shot pulse signal,
   an inflow transistor that receives the dummy control signal and causes a part to flow in, and
   a second transistor that is connected to a capacitive element via a resistive element for varying the dummy control signals to have time constants.

15. The semiconductor device according to claim 14, wherein a magnitude of the portion varies to have the time constants in the on-state.

16. A semiconductor device comprising:
   a stabilized power supply circuit that generates a first voltage;
   a charge pump circuit that generates a second voltage using the first voltage, compares the second voltage with a reference voltage, and outputs comparison result signals; and
   a dummy load circuit that is controlled to be in an on-state or an off-state in response to the comparison result signals;
   wherein the stabilized power supply circuit comprises:
      a power supply transistor in which an external power supply is connected to one of a source and a drain;
      a dividing circuit for a power supply having a variable resistor, one end of which is connected to an other end of the power supply transistor and the other end of which is grounded; and
      an amplifier circuit including:
         a non-inverting input terminal to which a reference voltage for power supply is input;
         an inverting input terminal that is connected to a first terminal for varying a voltage divider circuit for power supply; and
         an output terminal connected to a gate of the power supply transistor, and
   wherein the stabilized power supply circuit supplies at least a portion of a current based on the first voltage to the dummy load circuit in the on-state.

17. The semiconductor device according to claim 16, wherein the dividing circuit for power supply further has a second terminal for varying, and
wherein the dummy load circuit comprises:
   a dummy comparison circuit that has a non-inverting input terminal to which a dummy reference voltage is input;
   an inverting input terminal connected to a second terminal for varying a power supply voltage divider;
   a logic circuit outputting a dummy control signal to be turned on when receiving a dummy comparison result signal outputted from the dummy comparison circuit and the comparison result signal; and
   an inflow transistor that receives the dummy control signal and causes the dummy control signal to flow in a portion of the dummy control signal.

18. The semiconductor device according to claim 17, wherein the dummy reference voltage is set such that the first voltage is within predetermined detection levels.

19. The semiconductor device according to claim 1, further comprising:
   a predetermined circuit,
   wherein the first voltage is an internal voltage at which the predetermined circuits operate.

* * * * *